(12) United States Patent
Cao et al.

(10) Patent No.: US 9,159,908 B2
(45) Date of Patent: Oct. 13, 2015

(54) COMPOSITE FREE LAYER WITHIN MAGNETIC TUNNEL JUNCTION FOR MRAM APPLICATIONS

(75) Inventors: Wei Cao, San Jose, CA (US); Witold Kula, Sunnyvale, CA (US)

(73) Assignee: Headway Technologies, Inc., Milpitas, CA (US)

( * ) Notice: Subject to any disclaimer, the term of this patent is extended or adjusted under 35 U.S.C. 154(b) by 691 days.

(21) Appl. No.: 13/068,222

(22) Filed: May 5, 2011

(65) Prior Publication Data

US 2012/0280337 A1 Nov. 8, 2012

(51) Int. Cl.
| | |
|---|---|
| *H01L 43/10* | (2006.01) |
| *H01L 43/08* | (2006.01) |
| *G11C 11/16* | (2006.01) |
| *H01L 43/12* | (2006.01) |
| *H01F 41/30* | (2006.01) |
| *B82Y 40/00* | (2011.01) |
| *H01F 10/187* | (2006.01) |
| *H01F 10/32* | (2006.01) |

(52) U.S. Cl.
CPC .............. *H01L 43/10* (2013.01); *B82Y 40/00* (2013.01); *G11C 11/161* (2013.01); *H01F 10/3295* (2013.01); *H01F 41/303* (2013.01); *H01L 43/08* (2013.01); *H01L 43/12* (2013.01); *H01F 10/187* (2013.01); *H01F 10/3254* (2013.01); *H01F 10/3272* (2013.01)

(58) Field of Classification Search
CPC ............................... H01L 43/08; H01L 43/10
USPC ............... 257/421, E29.323, E21.665; 432/3; 365/158; 438/3
See application file for complete search history.

(56) References Cited

U.S. PATENT DOCUMENTS

| | | | |
|---|---|---|---|
| 7,528,457 B2 | 5/2009 | Horng et al. | |
| 7,595,520 B2 | 9/2009 | Horng et al. | |
| 7,663,131 B2 | 2/2010 | Horng et al. | |
| 7,672,093 B2 | 3/2010 | Horng et al. | |
| 7,808,027 B2 | 10/2010 | Horng et al. | |
| 2006/0262594 A1* | 11/2006 | Fukumoto | 365/158 |
| 2007/0034919 A1* | 2/2007 | Wang et al. | 257/295 |
| 2007/0097560 A1* | 5/2007 | Karr et al. | 360/324.2 |

(Continued)

OTHER PUBLICATIONS

PCT Search Report PCT/US 12/35101 Mail Date—Jul. 9, 2012, Magic Technologies, Inc.

(Continued)

*Primary Examiner* — Zandra Smith
*Assistant Examiner* — Lauren R Bell
(74) *Attorney, Agent, or Firm* — Saile Ackerman LLC; Stephen B. Ackerman

(57) ABSTRACT

A magnetic tunneling junction (MTJ) in an MRAM array is disclosed with a composite free layer having a FL1/FL2/FL3 configuration where FL1 and FL2 are crystalline magnetic layers and FL3 is an amorphous NiFeX layer for improved bit switching performance. FL1 layer is CoFe which affords a high magnetoresistive (MR) ratio when forming an interface with a MgO tunnel barrier. FL2 is Fe to improve switching performance. NiFeX thickness where X is Hf is preferably between 20 to 40 Angstroms to substantially reduce bit line switching current and number of shorted bits. Annealing at 330° C. to 360° C. provides a high MR ratio of 190%. Furthermore, low Hc and Hk are simultaneously achieved with improved bit switching performance and fewer shorts without compromising other MTJ properties such as MR ratio. As a result of high MR ratio and lower bit-to-bit resistance variation, higher reading margin is realized.

11 Claims, 2 Drawing Sheets

(56) References Cited

U.S. PATENT DOCUMENTS

| | | | |
|---|---|---|---|
| 2007/0243638 A1* | 10/2007 | Horng et al. | 438/3 |
| 2008/0032159 A1 | 2/2008 | Gill | |
| 2008/0219042 A1* | 9/2008 | Wang et al. | 365/158 |
| 2009/0108383 A1* | 4/2009 | Horng et al. | 257/421 |
| 2010/0019333 A1 | 1/2010 | Zhao et al. | |
| 2010/0073828 A1 | 3/2010 | Wang et al. | |
| 2010/0258886 A1 | 10/2010 | Wang et al. | |
| 2010/0261295 A1 | 10/2010 | Horng et al. | |
| 2011/0006384 A1* | 1/2011 | Peng et al. | 257/421 |
| 2013/0043471 A1* | 2/2013 | Cao et al. | 257/53 |

OTHER PUBLICATIONS

"Magnetic Tunnel Junctions for Spintronic Memories and Beyond," by Shoji Ikeda et al., IEEE Transactions on Electron Devices, vol. 54, No. 5, May 2007, pp. 991-1002.

"70% TMR at Room Temperature for SDT Sandwich Junctions With CoFeB as Free and Reference Layers," by Dexin Wang et al., IEEE Transactions on Magnetics, vol. 40, No. 4, Jul. 2004, pp. 2269-2271.

"Giant tunnelling magnetoresistance at room temperature with MgO (100) tunnel barriers," by Stuart S. P. Parkin et al., 2004 Nature Publishing Group, nature materials/vol. 3, Dec. 2004/www.nature.com/naturematerials, pp. 862-867.

"Dependence of Giant Tunnel Magnetoresistanace of Sputtered CoFeB/MgO/CoFeB Magnetic Tunnel Junctions on MgO Barrier Thickness and Annealing Temperature," by Jun Hayakawa et al., pp. 1-17, Journal of Applied Physics, vol. 44, No. 19, Dec. 2005.

Co-pending US Patent HMG10-018, U.S. Appl. No. 12/930,877, filed Jan. 19, 2011, "Improved Magnetic Tunnel Junction for MRAM Applications," assigned to the same assignee as the present invention.

* cited by examiner

| SCOJCIU | | 11 | 10 | 9 | 8 | 7 | 6 | 5 | 4 | 3 | 2 |
|---|---|---|---|---|---|---|---|---|---|---|---|
| | 12 | — | — | — | — | — | — | — | — | — | — |
| | 11 | — | — | — | — | — | 14 | 4 | 0 | 0 | — |
| | 10 | — | 0 | 0 | 0 | 1 | 1 | 1 | 1 | 0 | — |
| | 9 | 0 | 0 | 0 | 0 | 0 | 0 | 2 | 3 | 0 | — |
| | 8 | 2 | 0 | 0 | 1 | 4 | 11 | 0 | 4 | 1 | 2 |
| | 7 | 1 | 0 | 3 | 2 | 1 | 5 | 8 | 2 | 0 | 7 |
| | 6 | 1 | 1 | 0 | 1 | 4 | 12 | 1 | 0 | 0 | 1 |
| | 5 | 3 | 0 | 0 | 2 | 2 | — | 3 | 0 | 2 | 0 |
| | 4 | — | — | 0 | 0 | 0 | 0 | 0 | 0 | 0 | 0 |
| | 3 | — | — | 0 | 0 | 0 | 0 | 4 | 0 | — | — |
| | 2 | — | — | 3 | 0 | 0 | 6 | 1 | 0 | — | — |
| | 1 | — | — | — | — | — | — | — | — | — | — |

FIG. 3

| SXOJEJU | | 11 | 10 | 9 | 8 | 7 | 6 | 5 | 4 | 3 | 2 |
|---|---|---|---|---|---|---|---|---|---|---|---|
| | 12 | — | — | — | 1 | 0 | 1 | ### | — | — | — |
| | 11 | — | — | 0 | 0 | 0 | 0 | 1 | 2 | 0 | — |
| | 10 | — | 0 | 0 | 0 | 0 | 0 | 0 | 1 | 0 | — |
| | 9 | 1 | 0 | 0 | 0 | — | 1 | 0 | 3 | 0 | — |
| | 8 | 0 | 0 | 0 | 0 | 0 | 1 | 0 | 1 | 1 | 0 |
| | 7 | 0 | 0 | 0 | 3 | 6 | 0 | 0 | 1 | 3 | 1 |
| | 6 | 0 | 0 | 1 | 0 | 1 | 0 | 4 | 0 | 0 | 0 |
| | 5 | 0 | 1 | 0 | 0 | 0 | 0 | 2 | 1 | 0 | 0 |
| | 4 | — | — | 0 | 0 | — | 0 | 0 | 0 | 0 | 0 |
| | 3 | — | — | 1 | 0 | 0 | 4 | 0 | 0 | 0 | — |
| | 2 | — | — | 0 | 0 | 0 | 0 | 0 | 0 | — | — |
| | 1 | — | — | — | — | 1 | — | — | — | — | — |

FIG. 4

| JPB5YVU | | 11 | 10 | 9 | 8 | 7 | 6 | 5 | 4 | 3 | 2 |
|---|---|---|---|---|---|---|---|---|---|---|---|
| | 12 | — | — | — | — | 17 | 8 | 0 | — | — | — |
| | 11 | — | — | 33 | 29 | — | 0 | 104 | 62 | 0 | — |
| | 10 | — | 23 | 2 | 55 | 97 | 96 | — | 153 | 61 | — |
| | 9 | — | 0 | 11 | 103 | 170 | 62 | 205 | 15 | 124 | — |
| | 8 | 11 | 0 | 70 | 31 | 2 | 3 | 211 | 1 | — | 0 |
| | 7 | 8 | 38 | 60 | 4 | 0 | 381 | 0 | 0 | — | 109 |
| | 6 | 4 | 29 | 49 | 70 | 1 | 212 | 266 | 138 | — | 52 |
| | 5 | 0 | 0 | 0 | 0 | 61 | 59 | 215 | 16 | — | — |
| | 4 | — | — | 19 | 0 | 2 | 7 | 151 | 30 | 73 | 19 |
| | 3 | — | — | 23 | 50 | 83 | 15 | 0 | 17 | 0 | — |
| | 2 | — | — | 0 | 0 | 25 | 34 | 8 | — | — | — |
| | 1 | — | — | — | — | — | — | — | — | — | — |

FIG. 5 ns because the NiFe layer with fcc (111) crystal structure

COMPOSITE FREE LAYER WITHIN MAGNETIC TUNNEL JUNCTION FOR MRAM APPLICATIONS

RELATED PATENT APPLICATIONS

This application is related to the following: U.S. Pat. No. 7,528,457; U.S. Pat. No. 7,595,520; U.S. Pat. No. 7,663,131; U.S. Pat. No. 7,672,093; and Ser. No. 12/930,877; filing date Jan. 19, 2011; all assigned to a common assignee and herein incorporated by reference in their entirety.

FIELD OF THE INVENTION

The invention relates to a high performance Magnetic Tunneling Junction (MTJ) element and a method for making the same, and in particular, to a composite free layer comprised of a FL1/FL2/FL3 stack wherein FL1 is a first crystalline magnetic layer contacting a tunnel barrier layer, FL2 is a second crystalline magnetic layer, and FL3 is an amorphous layer to reduce MTJ shorting without adversely affecting the properties of the crystalline free layers.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations. A high speed version of MRAM architecture consists of a cell with an access transistor and a MTJ (1T1MTJ) in the array.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. In a MRAM MTJ, the free layer has traditionally been made of NiFe because of its reproducible and reliable switching characteristics as demonstrated by a low switching field (Hc) and low switching field uniformity (σHc).

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

An alternative MRAM technology has been developed in the past several years and is called spin-transfer MRAM or STT-RAM. The spin-transfer effect arises from the spin dependent electron transport properties of ferromagnetic-spacer-ferromagnetic multilayers. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic (free) layer if the current density is sufficiently high, and if the dimensions of the multilayer are small. The difference between a SU-RAM and a conventional MRAM is only in the write operation mechanism. The read mechanism is the same.

A high performance MRAM MTJ element is characterized by a high tunneling magnetoresistive (TMR) ratio also referred to as MR ratio where MR is the resistance change ratio as a result of switching from a low resistance state (Rp) to a high resistance state (Rap) and expressed as (Rap-Rp)/Rp. Other MTJ parameters that are important for MRAM performance are low bit-to-bit resistance variation, low number of shorted bits, and low bit-to-bit switching current (or field) variation. Simultaneous optimization of all the aforementioned parameters is necessary for making high performance MRAM products that should have high reading margin and writing margin and lower error counts. Higher MR ratio and lower bit-to-bit resistance variation are necessary for high reading margin. Writing margin is more complicated and depends on many factors including magnetic free layer (coercivity and anisotropy energy), MTJ shape and size, and distance between the overlying word line/bit line and the free layer in the MTJ.

Numerous MTJ designs have been proposed and fabricated in the prior art but there is still a need for improvement in all of the performance categories mentioned above. Typically, an improvement in one property leads to a degradation in one or more other parameters. For example, NiFe affords excellent switching properties but the TMR ratio with a MTJ having a NiFe free layer is lower than can be achieved with CoFe, CoFeB, or other free layer materials. In addition, recent developments show that a MgO/CoFeB tunnel barrier/free layer configuration exhibits very high MR ratio (>200%) but this structure could not be directly applied in MRAM because a MTJ with a CoFeB free layer shows very poor writing margin (wide bit-to-bit switching current) due to its high anisotropy energy. Moreover, a high switch current is needed because of high coercivity associated with a CoFeB free layer. Even a CoFeB/NiFe composite free layer no longer exhibits a high MR characteristic of MgO/CoFeB configurations because the NiFe layer with fcc (111) crystal structure prevents the adjacent CoFeB layer from crystallizing in the bcc (001) phase necessary for high spin polarization (and thus high MR ratio) at the MgO/CoFeB interface.

U.S. Pat. No. 7,808,027 discloses a composite free layer with a NiFeCo/NiFe/NiFeHf configuration that is designed to provide a MR ratio of about 50%, high read margin, and low magnetostriction (λs).

In U.S. Pat. No. 7,672,093, NiFeMg and NiFeHf layers are employed as capping layers that getter oxygen through an interface with a free layer which is a composite comprising two NiFe layers of opposite λs sign in order to achieve low magnetostriction.

U.S. Patent Application Publication 2010/0261295 teaches a free layer composite represented by Fe/amorphous CoFeB/Fe to achieve a low Gilbert damping constant, low critical current, high MR ratio, and low bit-to-bit resistance variation for a STT-MRAM application.

U.S. Patent Application Publication 2010/0258886 discloses a non-magnetic buffer layer such as Ta formed between two free layers in a MTJ stack. A key feature is the second free layer has a lower coercivity than the first free layer.

In spite of all recent advancements in optimizing a MTJ for MRAM, an improved MTJ is still required that improves bit line shorting and switching properties while maintaining a high TMR ratio and without compromising other important MTJ parameters.

SUMMARY OF THE INVENTION

One objective of the present invention is to provide an improved MTJ element that enhances MRAM performance by decreasing the number of shorts and reducing the number of unswitched bits at a given bit line current compared with the prior art.

A second objective of the present invention is to achieve the improved performance of the first objective while maintaining a high MR ratio for the MTJ.

According to a first embodiment, these objectives are achieved with a MTJ element comprised of at least a pinned layer/tunnel barrier layer/free layer configuration wherein a composite free layer adjoins a surface of the tunnel barrier layer which is preferably MgO. A key feature is the composite free layer has a trilayer stack represented by FL1/FL2/FL3 where FL1 is a crystalline ferromagnetic layer adjoining the tunnel barrier layer and responsible for generating a high MR ratio in the MTJ. The FL2 layer is a second crystalline ferromagnetic layer that enables excellent switching performance without compromising the high MR ratio established by the tunnel barrier/FL1 configuration. The FL3 layer is an amorphous layer preferably having a NiFeX composition where X is one of Hf, Zr, Nb, Mg, or Ta which reduces MTJ shorting without adversely affecting other MTJ properties. For example, a CoFe/Fe/NiFeHf composite free layer is especially suited to realize the objectives and advantages of the present invention. Preferably, the CoFe layer has an Fe content of 60 to 90 atomic %, and the NiFeHf layer should be in the range of 20 to 40 Angstroms thick to provide the full advantage of a reduced number of shorted bits and a substantially lower bit switching current. The composite free layer may be formed in a bottom spin valve configuration represented by seed layer/AFM layer/pinned layer/tunnel barrier/FL1/FL2/FL3/cap layer.

In a second embodiment, the composite free layer may be part of a top spin valve configuration represented by seed layer/FL3/FL2/FL1/tunnel barrier/pinned layer/AFM layer/cap layer.

Alternatively, in both embodiments described above, CoFe may be replaced by CoFeB or combinations of CoFe and CoFeB. In another aspect, Fe in the FL2 layer may be replaced by FeB.

BRIEF DESCRIPTION OF THE DRAWINGS

FIG. 3 is a table that shows the number of shorted bits on a wafer comprised of a plurality of MTJ elements arranged in rows and columns and having a CoFe/Fe/NiFeHf free layer structure according to a first embodiment of the present invention.

FIG. 4 is a table that shows the number of shorted bits on a wafer comprised of a plurality of MTJ elements arranged in rows and columns and having a prior art NiFe/NiFeHf (30 Angstrom) free layer structure.

FIG. 5 is a table that shows the number of shorted bits on a wafer comprised of a plurality of MTJ elements arranged in rows and columns and having a prior art NiFe/NiFeHf (10 Angstrom) free layer structure.

DETAILED DESCRIPTION OF THE INVENTION

The present invention relates to magnetic tunnel junctions (MTJs) in MRAM devices including STT-RAM. Although top and bottom spin valve structures are shown in the exemplary embodiments, the present invention also encompasses a dual spin valve configuration as appreciated by those skilled in the art. A top surface of a layer is defined as a surface formed in a plane that is parallel to the substrate and facing away from the substrate. The drawings are provided by way of example and are not intended to limit the scope of the invention.

It should be understood that the MRAM structure of the present invention is part of an MRAM array having a plurality of MTJ elements arranged in rows and columns on a substrate. Only one MTJ is depicted in the exemplary embodiments in order to simplify the drawings and direct attention to the key feature of the present invention which is a composite free layer in a MTJ stack of layers having a tunnel barrier layer formed between a pinned layer and a free layer.

Figure 1:
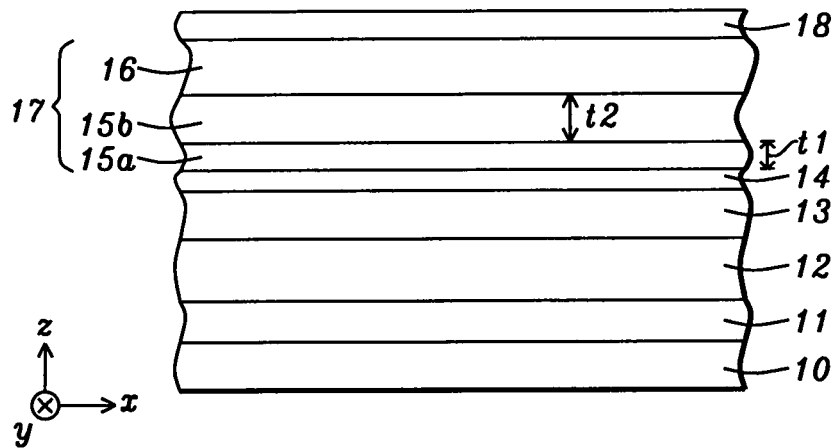
FIG. 1 is a cross-sectional view of a MTJ structure having a composite free layer formed according to a first embodiment of the present invention.

Referring to FIG. 1, a MTJ structure is illustrated according to a first embodiment of the present invention. The substrate 10 may be a bottom conductor layer, for example, having a thickness in the z-axis direction and with a top surface in the x,y plane. A MTJ stack of layers is now formed on the substrate 10. It should be understood that all layers in the MTJ stack may be formed in the same process tool such as an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. All MTJ layers may be formed after a single pump down of the sputter system to enhance throughput.

In the exemplary embodiment depicting a bottom spin valve structure, the MTJ stack of layers is fabricated on the substrate 10 by sequentially forming a seed layer 11, AFM layer 12, synthetic anti-parallel (SyAP) pinned layer 13, tunnel barrier layer 14, composite free layer 17, and a cap layer 18. The seed layer 11 may be a layer of NiCr, NiFe, or NiFeCr, for example. In an embodiment wherein the seed layer is grown on a bottom conductor with an amorphous Ta capping layer, a smooth and dense (111) seed layer structure results that promotes smooth and densely packed growth in subsequently formed MTJ layers.

The AFM layer 12 is preferably made of MnPt although IrMn, NiMn, OsMn, RuMn, RhMn, PdMn, RuRhMn, or MnPtPd are also acceptable. The SyAP pinned layer 13 has an AP2/Ru/AP1 configuration wherein the outer anti-parallel (AP2) layer is formed on the AFM layer 12 and is preferably comprised of CoFe although other ferromagnetic layers are acceptable. The magnetic moment of the AP2 layer is pinned in a direction anti-parallel to the magnetic moment of the inner anti-parallel (AP1) layer. A slight difference in thickness between the AP2 and AP1 layers produces a small net magnetic moment for the SyAP pinned layer 13 in an in-plane direction. Exchange coupling between the AP2 layer and the AP1 layer is facilitated by a coupling layer that is preferably comprised of Ru with a thickness of about 7.5 Angstroms although Rh or Ir may be used instead of Ru. The AP1 layer on the coupling layer may be comprised of CoFe, CoFeB, or combinations thereof.

Above the SyAP pinned layer 13 is formed a thin tunnel barrier layer 14 which in the preferred embodiment is made of MgO although AlOx, TiOx, or other tunnel barrier materials used in the art are also acceptable. A MgO tunnel barrier may be formed by depositing a first Mg layer, oxidizing by a radical oxidation method (ROX) or natural oxidation (NOX) method, and then depositing a second Mg layer. After a subsequent annealing step, the tunnel barrier essentially becomes a uniform MgO layer. Alternatively, the sequence of Mg layer deposition followed by an oxidation step may be repeated one or more times before an uppermost Mg layer is deposited on the tunnel barrier stack. Subsequent annealing then generates a uniform MgO tunnel barrier.

According to a first embodiment of the present invention, a key feature is the composite free layer 17 formed on the tunnel barrier 14. The composite free layer has a FL1/FL2/FL3 configuration wherein a first crystalline magnetic layer (FL1) 15a contacts a top surface of the tunnel barrier layer, and a second crystalline magnetic layer (FL2) 15b and an amorphous layer (FL3) 16 that may be either magnetic or non-magnetic are sequentially formed on the FL1 layer. Preferably, the FL1 layer 15a is made of CoFe with an Fe content of 60 to 90 atomic % and has a bcc (001) crystal structure to match that of the MgO tunnel barrier layer 14 and thereby promote coherent tunneling which leads to a high MR ratio. Alternatively, iron rich CoFeB may be used as the FL1 layer. In yet another embodiment, the FL1 layer may be comprised of a composite including a combination of CoFe and CoFeB layers such as CoFeB/CoFe. FL1 layer 15a is responsible for providing a high MR ratio as a result of its interface with the tunnel barrier layer. When the FL1 layer is CoFe, thickness is at least 4 Angstroms and preferably about 6 Angstroms in order to provide good film uniformity and high MR ratio. It is important that FL1 thickness is not allowed to increase significantly above 6 Angstroms so that magnetostriction and switching properties of the MTJ are not adversely affected.

FL2 layer 15b is relied upon to provide improved switching performance without degrading a high MR ratio established by the tunnel barrier/FL1 configuration. Accordingly, the FL2 layer is preferably Fe in a bcc (001) crystal phase and having a thickness from 12 to 21 Angstroms. It should be understood that the soft magnetic property of Fe enables better switching behavior than a hard magnetic property of CoFe.

Amorphous FL3 layer 16 is employed to improve one or more of switching performance and reduce shorting without adversely affecting the MR ratio or other desirable properties associated with the lower crystalline layers 15a, 15b. Preferably, the upper amorphous layer 16 has a thickness from 20 to 40 Angstroms and is comprised of NiFeX where X is one of Hf, Zr, Nb, Ta, or Mg with a content of about 5 to 30 atomic %. FL3 Layer 16 is preferably amorphous rather than crystalline so that the FL3 layer does not affect the crystal structure in the lower FL1, FL2 layers where a bcc (001) crystalline phase is preferred for high MR ratio. We have previously disclosed in U.S. Pat. Nos. 7,528,457, 7,595,520, 7,663,131, and 7,672,093 how a NiFeX capping layer may be used with various tunnel barrier/free layer configurations to enhance the MR ratio of a MTJ through an oxygen gettering effect. In U.S. Pat. No. 7,672,093, a NiFeHf capping layer is formed on a NiFe composite free layer comprised of two NiFe layers whose magnetostriction constants are of opposite sign. In related patent application HMG10-018, we disclosed how a Fe/NiFeX or Fe/NiFe/NiFeX composite free layer offers additional benefits by reducing the number of shorted bits and lowering the bit switching current.

FL1 layer 15a should be at least 4 to 6 Angstroms thick in order to achieve a high MR ratio of at least 180% or higher. Thinner layers may have pinholes that degrade MTJ performance. FL2 layer thickness may be adjusted between 12 and 21 Angstroms to satisfy the Mst (magnetic saturation×thickness) requirement for free layer 17. Moreover, FL2 thickness is preferably greater than FL1 thickness for optimum MTJ performance. Note that the amorphous FL3 layer 16 generally contributes substantially less toward the Mst requirement for the composite free layer than the FL1 and FL2 layers 15a, 15b because the magnetic moment of the NiFeX layer is reduced by the presence of the X element.

The minimum X content necessary to achieve an amorphous NiFeX film is about 5 atomic % for X. On the other hand, the X content should not be more than about 30 atomic %, especially for Ta or Nb, to prevent X from diffusing into the crystalline magnetic layers 15a, 15b and degrading the free layer properties. It should also be understood that the magnetostriction ($\lambda$) of the free layer 17 may be adjusted by changing the thicknesses of the layers 15a, 15b, 16, and by modifying the X content in NiFeX. Although both Fe and NiFeX, for example, typically contribute a positive value to X, for free layer 17, CoFe provides the largest (+) $\lambda$ contribution in a CoFe/Fe/NiFeHf composite. As the % X in NiFeX increases, $\lambda$ generally increases. Those skilled in the art will appreciate that a NiFeX alloy may have either a (+) or (−) $\lambda$ value, depending on the Ni content and X content in the alloy. Typically, a $\lambda$ approaching $1 \times 10^{-6}$ is desirable for the free layer 17.

The capping layer 18 formed on the free layer 17 may have a Ta or Ta/Ru composition although other capping layer materials may be used. The capping layer serves as an electrical contact with an overlying top electrode (bit line) and typically is employed as an etch stop and/or chemical mechanical polish (CMP) stop layer during subsequent processing steps. A Ta capping layer 18 serves as an oxygen getter layer to prevent oxygen from diffusing into the crystalline magnetic layer and lowering the TMR ratio, and is preferably an α-phase Ta layer with a low resistance.

Figure 2:
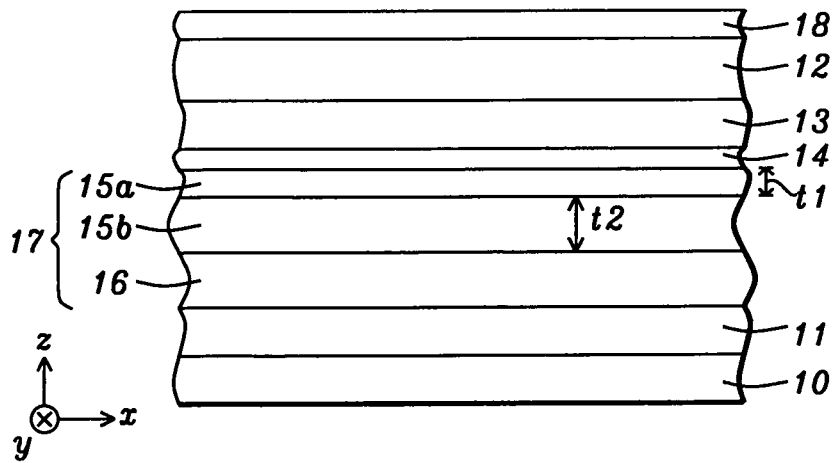
FIG. 2 is a cross-sectional view of the MTJ structure having a composite free layer formed according to a second embodiment of the present invention.

According to a second embodiment of the present invention as depicted in FIG. 2, the free layer 17 as described in the first embodiment may be formed in a top spin valve configuration. For example, the MTJ stack may be fabricated by sequentially forming a seed layer 11, composite free layer 17, tunnel barrier 14, pinned layer 13, AFM layer 12, and capping layer 18 on substrate 10. In this case, free layer 17 has a FL3/FL2/FL1 configuration wherein the FL3 layer 16 contacts a top surface of seed layer 11 and FL1 layer 15a interfaces with the tunnel barrier 14 to produce a high MR ratio. The properties and thicknesses of the aforementioned layers are retained from the first embodiment.

For improved flexibility in modifying the NiFeX composition, the NiFeX layer 16 in a MTJ stack is preferably deposited by co-sputtering NiFe and X targets. In one embodiment, the NiFe target and X target are placed at alternating positions in a sputter (PVD) chamber. For example, the NiFe target may be placed at position 2 in an Anelva C-7100 sputtering chamber while the X target is located at target position 4. Optionally, the NiFe target may be placed at position 1 and the X target at position 3. In one embodiment, the NiFe target has a Ni content of 80 atomic % and a Fe content of 20 atomic % although Ni/Fe ratios other than 4:1 may be employed.

It should be understood that the sputter deposition rate of a specific metal is dependent on the sputter power applied to the target cathode. Thus, the concentration of the NiFeX layer is controlled by the power applied simultaneously to the two respective targets. In the example where X is Mg, the Mg deposition rate is faster than the NiFe deposition rate using the same applied power. To compensate for the unequal deposition rates, a higher forward power is applied to the NiFe target than to the Mg target. The preferred deposition method comprises applying a forward power of 30 Watts (W) to 80 W, and more preferably 50 W, to the Mg target and a forward power of 100 W to 500 W, and more preferably 200 W, to the NiFe target to deposit a NiFeMg layer at a pressure less than about 0.3 mTorr and at ambient temperature. The non-magnetic property, $B_S$ (magnetic moment), of the co-sputtered NiFeMg film is measured with a B-H looper. Composition of the non-magnetic NiFeMg alloy is analyzed with a well known EDS system using electron microscopy. The present invention also encompasses an embodiment in which a NiFeX target is sputtered to form a NiFeX layer in the MTJ stack in cases where X has a sufficiently low atomic % to allow a NiFeX target of sufficient size to be useful in a manufacturing scheme.

It is believed that one important mechanism responsible for achieving a high TMR ratio involves gettering oxygen from the FL1, FL2 crystalline magnetic layers 15a, 15b by the NiFeX layer 16. Thus, FL1 and FL2 magnetic layers are less oxygen contaminated and have higher conductivity, thereby improving dR/R. Although the actual mechanism is not understood at this time, it is believed that the oxygen gettering power of a NiFeX layer may be at least partially responsible for an improved switching property and reduced bit shorts as described herein.

The present invention also encompasses an annealing step after all of the MTJ layers have been deposited. For example, in the first and second embodiments, the MTJ stack of layers is preferably annealed by applying a magnetic field of about 10K Oe in magnitude along the desired in-plane magnetization direction for about 1 hour at 360° C. or approximately 2 hours at a temperature of 330° C.

After all of the MTJ layers have been deposited and annealing is completed, an MTJ element with sidewalls and a top surface having a circular, elliptical, or polygonal shape from a top view (not shown) may be fabricated by conventional photoresist patterning and etching techniques as previously described in U.S. Pat. No. 7,595,520 which is herein incorporated by reference in its entirety. Thereafter, the remainder of the MRAM structure is formed by well known methods including deposition of an interlevel dielectric layer (ILD) adjacent to the MTJ element and thereby electrically separating the MTJ from other MTJ elements in the MRAM array (not shown). Typically, a CMP step is performed to provide an ILD that is coplanar with the top surface of the MTJ. Then a metal layer (not shown) including bit lines, for example, is formed on the ILD and top surfaces of the MTJ elements in the MRAM array.

An experiment was conducted to determine the performance of a MTJ stack formed on a substrate according to a first embodiment of the present invention and shown in Table 1 as Sample Emb. 1. All of the reference samples listed as Ref. 1 through Ref. 6 were previously prepared by the inventors for evaluating various MTJ characteristics and have the same MTJ layers except for the free layer composition. All MTJ stacks have a bottom spin valve configuration represented by the following: NiCr45/MnPt150/Co$_{90}$Fe$_{10}$24/Ru/Co$_{60}$Fe$_{20}$B$_{20}$23/MgO15/free layer/Ta510 where the number following the composition of each layer is the thickness in Angstroms of that layer. As a result, differences in MTJ properties shown in Table 1 are solely related to changes in the free layer content. The pinned layer has a CoFe/Ru/CoFeB configuration and the MgO tunnel barrier layer was formed by depositing a first Mg layer, performing a radical oxidation (ROX), and then depositing a second Mg layer. Each MTJ stack was annealed with an in-plane magnetic field of 10000 Oe for 2 hours at 330° C. Results in Table 1 were obtained by using a Capres CIPT (current in plane tunneling) tool that measures dR/R on an unpatterned MTJ stack.

TABLE 1

Magnetic properties of MTJs with different free layer (FL) in NiCr45/PtMn150/CoFe24/Ru7.5/CoFeB23/MgO15/FL/Ta510

| Sample | Free layer configuration | Bs (nWb) | Hc (Oe) | Hk (Oe) | RA (ohm-um2) | MR (%) | Lambda (λs) |
|---|---|---|---|---|---|---|---|
| Emb. 1 | Co$_{30}$Fe$_{70}$6/Fe12/NiFeHf30 | 0.875 | 4.4 | 3.7 | 320 | 190 | 7.9E−06 |
| Ref. 1 | Fe16.3/NiFeHf30 | 0.837 | 3.9 | 4.8 | 327 | 165 | 4.7E−06 |
| Ref. 2 | Fe20/NiFeHf10 | 0.816 | 3.6 | 4.0 | 445 | 163 | 3.9E−06 |
| Ref. 3 | Co$_{30}$Fe$_{70}$18/NiFeHf30 | 0.936 | 9.8 | 13.1 | 331 | 178 | 1.2E−05 |
| Ref. 4 | Co$_{20}$Fe$_{60}$B$_{20}$19 | 0.602 | 11.4 | 10.1 | 300 | 180 | 6.1E−06 |
| Ref. 5 | Fe6/NiFe23/NiFeHf30 | 0.816 | 6.0 | 12.1 | 494 | 148 | 1.2E−05 |
| Ref. 6 | NiFe34/NiFeHf35 | 0.723 | 4.8 | 8.3 | 696 | 81 | 9.2E−07 |

In all examples except reference 4, a Ni$_R$Fe$_S$Hf$_T$ layer where R=78, S=10, and T=12 was deposited by co-sputtering a Ni$_{88}$Fe$_{12}$ target and a Hf target in an Anelva 7100 sputter deposition system. The preferred deposition method comprises applying a forward power of 100 Watts (W) to 300 W to the Hf target and a forward power of 200 W to 600 W to the NiFe target to deposit a NiFeHf layer at a pressure less than about 0.3 mTorr and at an ambient temperature. As indicated in Table 1, the Embodiment 1 sample has a higher MR ratio and lower Hc and lower Hk than for the six reference samples which demonstrates that all three of the aforementioned properties can be optimized simultaneously by implementing a composite free layer according to the present invention. Note that a CoFeB free layer (Ref. 4) and a CoFe/NiFeHf composite free layer where a middle Fe layer has been omitted and CoFe thickness increased (Ref. 3) both afford significantly higher Hc and Hk that will degrade switching performance even though the MR value is high. A composite free layer shown in Ref. 6 where NiFe interfaces with a MgO tunnel barrier leads to substantially lower MR and thus a lower reading margin.

Referring to Table 2, the reading margin for several samples from Table 1 was determined by the ratio MR/Rp_cov. MR is the resistance change ratio as a result of switching from a low resistance state (Rp) to a high resistance state (Rap) and is expressed as MR=(Rap−Rp)/Rp. Rp_cov is the bit-to-bit resistance variation wherein Rp_cov=1 sigma (Rp)/Mean (Rp). As the MR/Rp_cov ratio increases, reading margin becomes larger. The results in Table 2 indicate the sample representing embodiment 1 has a substantially higher reading margin than references 1 and 5.

TABLE 2

Effect of free layer (FL) composition on reading margin for MTJs with NiCr45/PtMn150/CoFe24/Ru7.5/CoFeB23/MgO15/FL/Ta510 configuration

| Sample | Free layer configuration | MR/Rp_cov |
|---|---|---|
| Embodiment 1 | $Co_{30}Fe_{70}6$/Fe12/NiFeHf30 | 19 |
| Reference 1 | Fe16.3/NiFeHf30 | 15.1 |
| Reference 5 | Fe6/NiFe23/NiFeHf30 | 12 |

The MTJ stack representing the first embodiment of the present invention was then patterned by a conventional process to form an array of MTJ elements which were incorporated into one of our 16 Mb MRAM designs. As a comparison, MTJ stacks having Fe/NiFeHf30 and Fe/NiFeHf10 free layer configurations were also processed into 16 Mb MRAM chips. The number of shorted bits per 0.5 Mb section of a 16 Mb chip, measured for multiple chips across an 8 inch wafer, are shown in FIGS. 3 to 5. Each number listed according to column and row corresponds to one chip. The wafer in FIG. 3 was fabricated from a MTJ stack according to Embodiment 1, the wafer in FIG. 4 was made from a MTJ stack as in Ref. 1, and the wafer in FIG. 5 is from a MTJ stack where the NiFeHf thickness in Ref. 1 was reduced to 10 Angstroms. Note that a thicker amorphous NiFeHf layer of 30 Angstroms is required to provide a lower number of MTJ shorts as illustrated in FIGS. 3 and 4 compared with FIG. 5. However, the FIG. 3 design is preferred overall because of a lower MR ratio and lower reading margin associated with Fe/NiFeHf composite free layers. FIG. 5 indicates that a 10 Angstrom thick NiFeHf amorphous layer is not thick enough to yield all of the benefits of the composite free layer according to the present invention. We have discovered that a NiFeHf thickness of at least 20 to 25 Angstroms for the FL3 amorphous layer in our FL1/FL2/FL3 composite free layer configuration is required to provide a significant reduction in the shorted bit number. On the other hand, a NiFeHf thickness above 40 Angstroms is likely to lead to a lower MR ratio.

Therefore, the composite free layer of the present invention leads not only to a higher MR ratio, lower Hc and lower Hk, but also a lower number of shorted bits. We have further determined that the bit switching characteristic expressed as the number of unswitched bits at a given bit line current of about 2.2 milliAmps in the aforementioned 16 Mb MRAM chip is essentially the same for the MTJs represented in FIGS. 3 and 4. Lowering the number of unswitched bits (error count) is another key improvement since it means the bit line current used to switch the bits for a MTJ of Embodiment 1 can be reduced with respect to prior art designs. Furthermore, lower switching current translates into less power consumption, lower heating, and improved reliability in the MRAM device comprised of MTJs of the present invention.

It should be understood that a magnetostriction approaching $1 \times 10^{-6}$ can achieved by adjusting the thicknesses of the FL1 and FL2 magnetic layers and the FL3 amorphous layer in the composite free layer, and by modifying the Ni and X content in the NiFeX amorphous layer. The co-sputtering of NiFe and X targets allows flexibility in depositing an amorphous NiFeX layer with a range of X content.

In summary, the present invention provides a combination of improved MTJ properties without sacrificing any desirable magnetic characteristics which is a design feature that has not been achieved by prior art designs. The combination of higher MR ratio, improved switching performance, and reduced number of shorted bits will enable advancements in MRAM, STT-MRAM, and related technologies that rely on a high performance MTJ element.

While this invention has been particularly shown and described with reference to, the preferred embodiment thereof, it will be understood by those skilled in the art that various changes in form and details may be made without departing from the spirit and scope of this invention.

We claim:

1. A magnetic tunneling junction (MTJ) element in a magnetic device, comprising:
   (a) a pinned layer formed on a substrate;
   (b) a tunnel barrier layer that forms a first interface with the pinned layer; and
   (c) a composite free layer consisting of a stack of three ferromagnetic layers in a FL1/FL2/FL3 configuration wherein FL1 is a first crystalline ferromagnetic layer with a first thickness that forms a second interface with the tunnel barrier layer along a surface that is opposite to the first interface, FL2 is a second crystalline ferromagnetic layer that is Fe with a second thickness substantially greater than the first thickness, and contacts a top surface of the FL1 layer, and FL3 is an amorphous NiFeX layer where X is one of Hf, Zr, Nb, Ta, or Mg and X has a content between 5 and 12 atomic % in the NiFeX layer, the amorphous NiFeX layer is the uppermost layer in the FL1/FL2/FL3 stack.

2. The MTJ element of claim 1 wherein the FL1 layer is comprised of CoFe with a Fe content between about 60 and 90 atomic % and the first thickness is about 4 to 6 Angstroms.

3. The MTJ element of claim 1 wherein the second thickness is from about 12 to 21 Angstroms.

4. The MTJ element of claim 1 wherein the amorphous NiFeX layer has a thickness between about 20 and 40 Angstroms.

5. The MTJ element of claim 1 wherein the MTJ element is comprised of a stack of layers wherein an anti-ferromagnetic (AFM) layer, the pinned layer, the tunnel barrier layer, the composite free layer, and a capping layer are sequentially formed on a seed layer.

6. The MTJ element of claim 1 wherein the tunnel barrier layer is MgO.

7. A magnetic tunneling junction (MTJ) element in a magnetic device, comprising:

(a) a composite free layer consisting of a trilayer stack with a FL3/FL2/FL1 configuration formed on a seed layer wherein FL1 is a first crystalline ferromagnetic layer with a first thickness that forms a first interface with a bottom surface of a tunnel barrier layer, FL2 is a second crystalline ferromagnetic layer that is Fe with a second thickness substantially greater than the first thickness, and contacts a bottom surface of the FL1 layer, and FL3 is an amorphous ferromagnetic NiFeX layer where X is one of Hf, Zr, Nb, Ta, or Mg and X has a content between 5 and 12 atomic % in the NiFeX layer, the amorphous NiFeX layer is the bottom layer in the FL3/FL2/FL1 stack;

(b) the tunnel barrier layer; and (c) a pinned layer that forms an interface with a top surface of the tunnel barrier layer.

8. The MTJ element of claim 7 wherein the FL1 layer is comprised of CoFe with a Fe content between about 60 and 90 atomic % and the first thickness is about 4 to 6 Angstroms.

9. The MTJ element of claim 7 wherein the second thickness is from about 12 to 21 Angstroms.

10. The MTJ element of claim 7 wherein the amorphous NiFeX layer has a thickness between about 20 and 40 Angstroms.

11. The MTJ element of claim 7 wherein the MTJ element is comprised of a stack of layers wherein the composite free layer, the tunnel barrier layer, the pinned layer, an anti-ferromagnetic (AFM) layer, and a capping layer are sequentially formed on the seed layer.

\* \* \* \* \*